(12) United States Patent
Nolan et al.

(10) Patent No.: US 8,026,761 B2
(45) Date of Patent: Sep. 27, 2011

(54) INSTRUMENTATION AMPLIFIER CALIBRATION METHOD, SYSTEM AND APPARATUS

(75) Inventors: James B. Nolan, Chandler, AZ (US); Kumen Blake, Gilbert, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 12/913,066

(22) Filed: Oct. 27, 2010

(65) Prior Publication Data

US 2011/0181361 A1 Jul. 28, 2011

Related U.S. Application Data

(60) Provisional application No. 61/298,371, filed on Jan. 26, 2010.

(51) Int. Cl.
*H03F 1/02* (2006.01)
(52) U.S. Cl. ............................................ 330/9; 330/254
(58) Field of Classification Search ........ 330/9, 252–261, 330/310–311
See application file for complete search history.

(56) References Cited

U.S. PATENT DOCUMENTS

| | | | |
|---|---|---|---|
| 6,034,569 A | 3/2000 | Lan et al. | 330/290 |
| 6,141,169 A | 10/2000 | Pietruszynski et al. | 360/67 |
| 6,538,507 B2 * | 3/2003 | Prentice et al. | 330/85 |
| 7,368,968 B1 | 5/2008 | Lai et al. | 327/307 |
| 7,541,857 B1 | 6/2009 | Wong et al. | 327/317 |
| 2008/0224768 A1 | 9/2008 | Yen et al. | 327/307 |

FOREIGN PATENT DOCUMENTS

WO 0227943 4/2002

OTHER PUBLICATIONS

International Search Report and Written Opinion for Application No. PCT/US2009/062043 (12 pages), Mar. 18, 2010.
International Search Report and Written Opinion for Application No. PCT/US2011/021704 (9 pages), Jun. 7, 2011.

* cited by examiner

*Primary Examiner* — Hieu P Nguyen
(74) *Attorney, Agent, or Firm* — King & Spalding L.L.P.

(57) ABSTRACT

Calibration of gain and/or offset of an instrumentation amplifier (INA) is accomplished by coupling an appropriate number of current sources, and/or current sinks, respectively, to first and/or second transconductance stage(s) of the INA. Gain and/or offset calibration of the INA may occur when requested by a user and/or the occurrence of an event(s). A voltage reference may be used in combination with a successive approximation register analog-to-digital converter in determining which ones of the current sources and sinks are coupled to the first and/or second transconductance stage(s) of the INA for gain and/or offset calibration thereof. After the gain and/or offset calibration of the INA is completed, the selection of the constant current sources and sinks used therefore may be stored in volatile or nonvolatile memory. Parity checking of the memory may be incorporated and if a parity error is detected, an auto-calibration of the INA may be initiated.

18 Claims, 5 Drawing Sheets

INSTRUMENTATION AMPLIFIER CALIBRATION METHOD, SYSTEM AND APPARATUS

RELATED PATENT APPLICATIONS

This application claims priority to commonly owned U.S. Provisional Patent Application Ser. No. 61/298,371; filed Jan. 26, 2010; entitled "Instrumentation Amplifier Calibration Method, System and Apparatus," by James B. Nolan and Kumen Blake; and U.S. patent application Ser. No. 12/559,579; filed Sep. 15, 2009; entitled "Self Auto-Calibration of Analog Circuits in a Mixed Signal Integrated Circuit Device," by James B. Nolan and Kumen Blake; wherein both are hereby incorporated by reference herein for all purposes.

TECHNICAL FIELD

The present disclosure relates to integrated circuit instrumentation amplifiers, and more particularly, to calibration of integrated circuit instrumentation amplifiers.

BACKGROUND

Integrated circuits are becoming far more sophisticated while continuing to drop in price. Combinations of both analog and digital functions fabricated on an integrated circuit die, or packaged in a multi-chip package (MCP), are becoming more prevalent and are further increasing the usefulness and reducing the cost of consumer and industrial products. The combination of a microcontroller, and analog and digital circuit functions on an integrated circuit die or in an MCP has also expanded the useful range of applications. Consumer and commercial products, such as, for example, but not limited to, appliances, telecommunications devices, automobiles, security systems, full-house instant hot water heaters, thermostats and the like, are being controlled by integrated circuit microcontrollers. Analog inputs for receiving sensor information and analog outputs for controlling functions are necessary for the application of these microcontrollers. Heretofore separate and discrete analog-to-digital and digital-to-analog interfaces were used to connect the digital microcontroller to the outside analog world.

Analog input devices such as an analog-to-digital converter (ADC) in conjunction with a separate operational amplifier (op-amp) were used to convert a time-varying analog signal into digital representations thereof for coupling to digital inputs and use thereof by the microcontroller. Voltage and current levels were also detected by discrete integrated circuit voltage comparators that changed a digital output state when a certain analog value was present on the input of the comparator.

The operational amplifier (and comparator) is generally a differential input (inverting and non-inverting inputs) analog device, and the circuit of the op-amp has inherent direct current (DC) input offset voltage that causes the output of the op-amp to be nonzero with a zero input voltage between the differential inputs (e.g., inputs connected together). Many applications require an op-amp with a very small input offset voltage. To achieve a small input offset voltage, normally a calibration step in the production of the op-amp is required. This calibration step takes time during manufacturing/testing of the op-amp, and is therefore generally expensive to perform. The calibration is typically performed at one operating point (e.g., temperature, common mode voltage, etc.) such that changes in operating environment, e.g., temperature, voltage, etc., are not compensated for in the manufacturing/testing thereof. Technology has now advance to the point where the analog input and output devices can be fabricated on the same integrated circuit die on which the digital microcontroller, and its support logic and memories are also fabricated. This creates an additional problem in that the equipment used to test the digital microcontroller functions is not capable of performing on-line calibration of analog functions efficiently. Therefore, additional testing equipment and testing steps are required at the time of manufacture. Also the test mode logic and interfacing/multiplexing circuits become more complicated, especially if the number pins (external connections) of integrated circuit package are few in number.

An instrumentation amplifier has sources of error, including offset error, gain error, and circuit parasitics that limit performance thereof. Calibration of the instrumentation amplifier is desirable to reduce these errors, making the instrumentation amplifier suitable for a broader range of applications.

SUMMARY

Therefore there is a need to be able to automatically reduce offset and gain errors of an analog input device, e.g., an instrumentation amplifier. It is also desirable that an analog input device may be calibrated in an end user system application to meet the desired specifications and operating parameters over all operating conditions such as temperature, voltage, current, speed, power, pressure, humidity, etc., that may be encountered during normal operation and any changes thereof, and can be mass-produced to reduce overall product costs. The analog input device may be fabricated on an integrated circuit having both analog and digital functions (e.g., a mixed-signal device). The analog input device may include, but is not limited to, a differential or single-ended input operational amplifier, a comparator, a programmable gain amplifier (PGA), an instrumentation amplifier (INA), low noise amplifier, etc. An example of a mixed-signal device having offset voltage calibration is described in commonly owned U.S. Pat. No. 6,459,335; entitled "Auto-Calibration Circuit to Minimize Input Offset Voltage in an Integrated Circuit Analog Input Device," by Hartono Darmawaskita, Layton Eagar and Miguel Moreno; and is hereby incorporated by reference herein for all purposes.

This need may be satisfied, according to the teachings of this disclosure, with an apparatus and method for auto-calibration of both gain and offset of the analog circuits when requested by a user and/or the occurrence of an event(s). The user may invoke an auto-calibration of gain and/or offset on demand through an auto-calibration ($A_{CAL}$) input to the mixed-signal integrated circuit. A reference voltage ($V_{CAL}$) calibration input may be used for auto-calibration of the mixed-signal integrated circuit to a user-supplied common-mode voltage reference. Auto-calibration of gain and/or offset of the mixed-signal integrated circuit device may also be initiated upon the occurrence of any one or more of the following events, such as for example but not limited to: 1) detection of auto-calibration data corruption, e.g., parity checking of auto-calibration data values digitally stored in the mixed-signal integrated circuit; 2) an internal timer that causes a calibration request after a programmable timeout period, 3) change in the internal integrated circuit die temperature as determined by a temperature sensor, and 4) change in the power supply and/or internal supply voltage(s) from internal regulator(s) (e.g., bias network).

In addition, a user may compensate with calibration of the gain and/or offset of the analog circuits to compensate for variations in the end system, including operating point, e.g., power supply, common-mode, etc.; environmental changes, e.g., temperature, humidity, etc.; and also to compensate for component drift over time, e.g., aging effects, etc.

During gain adjustment calibration a reference voltage, $V_{CAL}$, is applied to an input of the analog device and the output of the analog device is compared to the reference voltage, $V_{CAL}$, with a voltage comparator. A digital control circuit is used to apply a digital word to the gain adjustment circuit for determining a digital value representative of the required gain adjustment calibration. During offset calibration the differential inputs of the analog device are shorted together and also connected to a reference voltage, e.g., $V_{CAL}$. The output of the analog device is compared to the reference voltage, $V_{CAL}$, with the voltage comparator. The digital control circuit applies a digital word to the input offset compensation circuit for determining a digital value representative of the required input offset compensation. A linear search or binary search of various digital values of the digital word may be used by the digital control circuit to accomplish both gain and offset calibration.

A voltage comparator compares the output of the analog input device and a voltage reference. When the output of the analog input device is equal to or greater than the voltage reference, the comparator output switches from a first logic level to a second logic level. The output of the comparator is connected to the digital control circuit and signals the digital control circuit by changing its output logic level.

The voltage reference may be programmable for selecting a desired voltage value to be applied to the analog input device and comparator inputs during the gain and/or offset calibration cycle(s). This allows the ability to vary the voltage reference so as to facilitate calibration at the common mode voltage which is very close to that of the application of use. The appropriate voltage reference value may be written to a control register associated with the voltage reference circuit before initiating the auto calibration of the analog input device. Different voltage reference values may be used for different analog input devices during gain and/or input offset voltage compensation calibration thereof.

Fuse links, programmable read only memory, etc. may be used to control compensation switches for the gain and input offset adjustments. However, a preferred way to accomplish gain adjustment and/or input offset voltage compensation circuit of the analog input device is to use at least one storage register or memory that retains the digital value(s) used to control switches for connecting constant current sources and sinks in the differential analog input circuits necessary to compensating the gain and/or input offset voltage of the INA. The storage register(s) may be volatile or nonvolatile depending upon the application desired. Therefore, no factory calibration during manufacture and/or testing is required, programmable fuse link trimming may be eliminated, and end user application flexibility increased.

A plurality of analog input devices may have their gains and/or input offsets calibrated by multiplexing the digital control circuit and comparator between each of the plurality of analog input devices. Thus circuits and die area are reduced, saving costs and improving reliability of a mixed-signal integrated circuit device.

According to a specific example embodiment of this disclosure, an instrumentation amplifier having gain and offset calibration using constant current sources and sinks comprises: a first transconductance stage having positive and negative voltage inputs, and positive and negative current outputs; a second transconductance stage having positive and negative voltage inputs, and positive and negative current outputs; a trans-impedance amplifier having positive and negative current inputs and a voltage output; the positive current outputs of the first and second transconductance stages and the positive current input of the trans-impedance amplifier are coupled together; the negative current outputs of the first and second transconductance stages and the negative current input of the trans-impedance amplifier are coupled together; a first plurality of constant current sources; a first plurality of switches, wherein the first plurality of switches selectably couple certain ones of the first plurality of constant current sources to the first transconductance stage; a second plurality of constant current sources; a second plurality of switches, wherein the second plurality of switches selectably couple certain ones of the second plurality of constant current sources to the second transconductance stage; a third plurality of constant current sinks; a third plurality of switches, wherein the third plurality of switches selectably connect certain ones of the third plurality of constant current sinks to the positive current outputs of the first and second transconductance stages; a fourth plurality of constant current sinks; and a fourth plurality of switches, wherein the fourth plurality of switches selectably couple certain ones of the fourth plurality of constant current sinks to the negative current outputs of the first and second transconductance stages; whereby gain adjustment of the instrumentation amplifier is provided by selectably coupling the certain ones of the first and second plurality of constant current sources to the first and second transconductance stages, respectively; and whereby input offset adjustment of the instrumentation amplifier is provided by selectably coupling the certain ones of the third and fourth plurality of constant current sinks to the positive current outputs and the negative current outputs, respectively, of the first and second transconductance stages.

According to another specific example embodiment of this disclosure, a method for calibrating gain and offset of an instrumentation amplifier using constant current sources and sinks comprises the steps of: adjusting gain of an instrumentation amplifier by selectably coupling certain ones of a plurality of constant current sources to first and second transconduction stages of the instrumentation amplifier; and adjusting offset of the instrumentation amplifier by selectably coupling certain ones of a plurality of constant current sinks to positive and negative outputs of the first and second transconduction stages of the instrumentation amplifier. coupling a positive input of the instrumentation amplifier to a first gain setting resistor network and a negative input of the instrumentation amplifier to a power source common; coupling a feedback input of the instrumentation amplifier to a second gain setting resistor network and a reference input of the instrumentation amplifier to the power source common, wherein the first and second gain setting resistor networks are substantially the same; comparing an output voltage of the instrumentation amplifier to the reference voltage; and selectably coupling certain ones of the plurality of constant current sources to the first and second transduction stages of the instrumentation amplifier until the output voltage from the instrumentation amplifier is substantially the same as the reference voltage. The step of adjusting the offset of the instrumentation amplifier comprises the steps of: coupling positive and negative inputs of the instrumentation amplifier to a reference voltage; coupling a feedback input of the instrumentation amplifier to a gain setting resistor network and a reference input of the instrumentation amplifier to the reference voltage; comparing an output voltage of the instrumentation amplifier to a reference voltage; and selectably coupling certain ones of the plurality of constant current sinks to the positive and negative outputs of the first and second transduction stages of the instrumentation amplifier until the output voltage from the instrumentation amplifier is substantially the same as the reference voltage. The step of adjusting the gain occurs before the step of adjusting the offset because the gain adjustment may affect offset, but not vice versa.

BRIEF DESCRIPTION OF THE DRAWINGS

A more complete understanding of the present disclosure thereof may be acquired by referring to the following description taken in conjunction with the accompanying drawings wherein.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

Referring now to the drawings, the details of example embodiments are schematically illustrated. Like elements in the drawings will be represented by like numbers, and similar elements will be represented by like numbers with a different lower case letter suffix.

Figure 1:
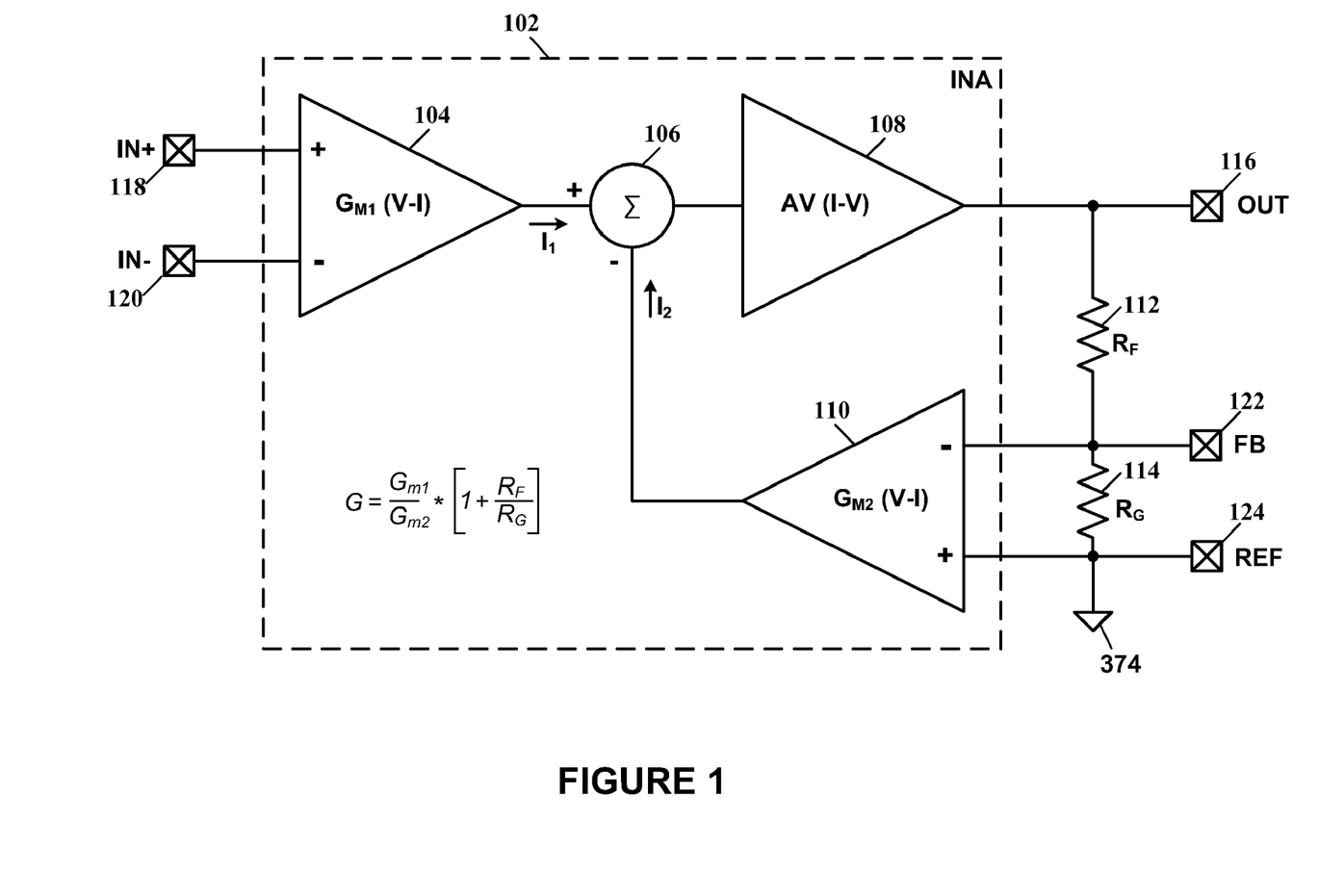
FIG. 1 illustrates a schematic block diagram of a basic architecture for an instrumentation amplifier (INA)

Referring to FIG. 1, depicted is a schematic block diagram of a basic architecture for an instrumentation amplifier (INA). An instrumentation amplifier (INA) 102 having indirect current feedback comprises a first transconductance stage 104, a second transconductance stage 110, a trans-impedance amplifier 108, and a summing node 106. The output current, $I_1$, from the first transconductance stage 104 is added in the summing node 106, and the output current, $I_2$, from the second transconductance stage 110 is subtracted in the summing node 106. The difference current output from the summing node 106 is applied to the trans-impedance amplifier 108 which converts this current input to a voltage output. The current summing operation provides for indirect current feedback. Ideally, the two output currents from the transconductance stages 104 and 110 should sum to zero, $I_1 - I_2 = 0$. Gain of the INA 102 is determined by the resistors 112 and 114 according to the formula:

$$G = G_{M1}/G_{M2} * (1 + R_F/R_G)$$

where G is the gain of the INA 102, $G_{M1}$ is the gain of the first transconductance stage 104, $G_{M2}$ is the gain of the second transconductance stage 110, $R_F$ is the resistance value of the resistor 112, and $R_G$ is the resistance value of the resistor 114.

Figure 2:
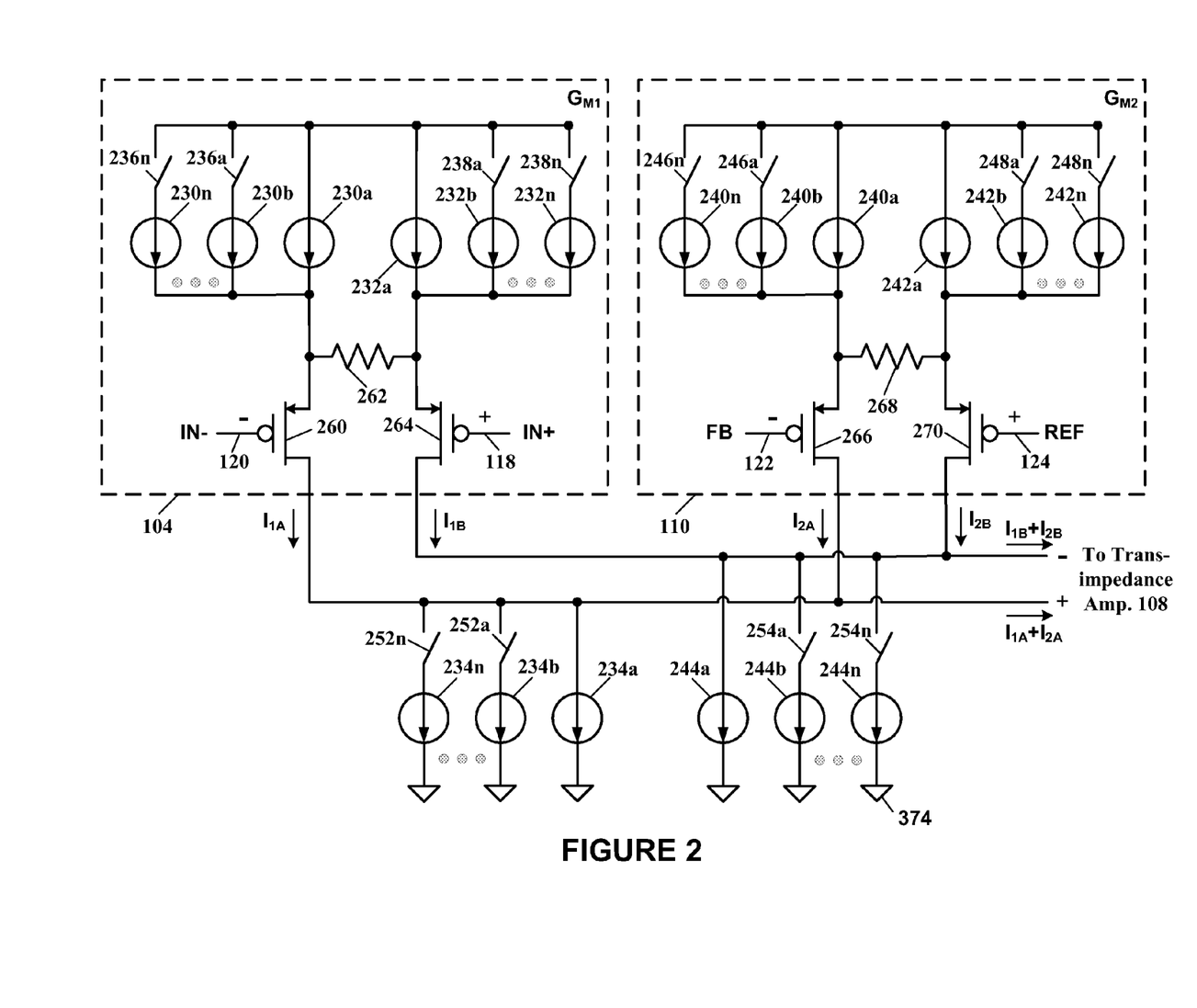
FIG. 2 illustrates a schematic diagram of a circuit for trimming gain and offset for the INA of FIG. 1, according to a specific example embodiment of this disclosure.

Referring to FIG. 2, depicted is a schematic diagram of a circuit for trimming gain and offset for the INA of FIG. 1, according to a specific example embodiment of this disclosure. The first transconductance stage 104 comprises transistors 260 and 264 connected as a differential input pair, a degeneration resistor 262, a plurality of constant current sources 230 and 232, and a plurality of switches 236 and 238 associated with the plurality of constant current sources 230 and 232, respectively. The second transconductance stage 110 comprises transistors 266 and 270 connected as a differential input pair, a degeneration resistor 268, a plurality of constant current sources 240 and 242, and a plurality of switches 246 and 248 associated with the plurality of constant current sources 240 and 242, respectively. Both of the transconductance stages 104 and 110 share a plurality of constant current sinks 234 and 244, and a plurality of switches 252 and 224 associated with the plurality of constant current sinks 234 and 244, respectively. The plurality of constant current sinks 234 and 244 are used to trim the offset of the INA 102. The plurality of constant current sinks 234 for offset trimming are associated with a positive (+) current rail of a load to the trans-impedance amplifier 108, and the plurality of constant current sinks 244 for offset trimming are associated with a negative (−) current rail of the load to the trans-impedance amplifier 108. The transistors 260, 264, 266 and 270 may be for example, but not limited to, metal oxide semiconductor field effect transistors (MOSFETs), e.g., either P-channel or N-channel.

The gain of the INA 102 is adjusted by changing the tail constant current sources 230 and 232 for the transconductance stage 104, and/or the tail constant current sources 240 and 242 for the transconductance stage 110.

Offset trimming is accomplished by adjusting the plurality of constant current sinks 234 and 244 on either side (+ and −) of the differential pair load. An advantage of trimming offset at the differential pair load is that it does not affect the gain of the INA 102. Therefore, preferably the gain of the INA 102 may be adjusted first then the offset thereof trimmed to substantially zero. Thereby any additional offset introduced by the gain adjustment may be compensated for during the offset trimming operation.

Figure 3:
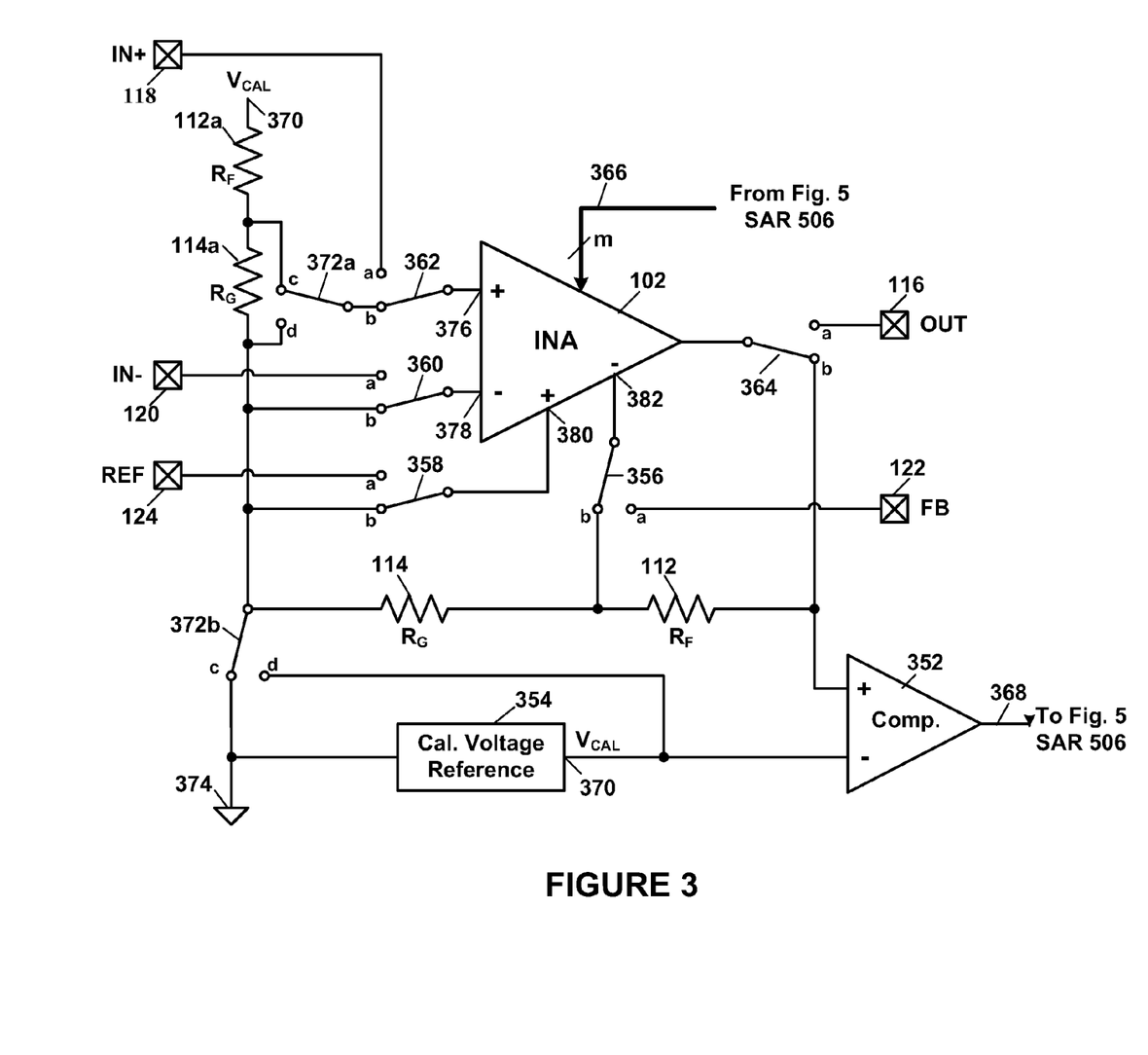
FIG. 3 illustrates a schematic circuit diagram of a switching arrangement for gain calibration of the INA of FIG. 1, according to the teachings of this disclosure.

Referring to FIG. 3, depicted is a schematic circuit diagram of a switching arrangement for gain calibration of the INA of FIG. 1, according to the teachings of this disclosure. Calibration switches 356-364 are shown connected in position "b" and gain/offset calibration switches 372a and 372b are shown connected in position "c" for gain calibration. For normal operation of the INA 102 the calibration switches 356-364 would be connected in position "a". The positions of the gain/offset calibration switches 372a and 372b are irrelevant during normal operation of the INA 102.

During gain calibration, when the calibration switches 356-364 are in position "b" and the gain/offset calibration switches 372a and 372b are in position "c", the positive input of the INA 102 is connected to the junction of an internal feedback resistor 112a ($R_F$) and an internal gain setting resistor 114a ($R_G$). The other end of the internal feedback resistor 112a ($R_F$) is connected to the reference voltage 370, $V_{CAL}$, from the calibration voltage reference 354, and the other end of the internal gain setting resistor 114a ($R_G$) 114a is connected to a common reference potential 374, e.g., ground. A negative input of the INA 102 is connected to the common reference potential 374, e.g., ground; the external nodes 116 (OUT), 118 (IN+), 120 (IN−), 122 (FB) and 124 (REF) are disconnected from the INA 102. The reference input 380 of the INA 102 is connected to the common reference potential 374, e.g., ground. The feedback input 382 of the INA 102 is connected to the to the junction of an internal feedback resistor 112 ($R_F$) and an internal gain setting resistor 114 ($R_G$).

The internal gain setting resistors 114 and 114a ($R_G$), and the internal feedback resistors 112 and 112a ($R_F$) are connected to the INA 102 during the gain calibration operation. The internal gain setting resistors 114 and 114a ($R_G$), and the internal feedback resistors 112 and 112a ($R_F$) configure the INA 102 to have high gain for more accurate gain calibration. The internal gain setting resistors 114 and 114a ($R_G$) are matched to have substantially the same resistances. Similarly, the internal feedback resistors 112 and 112a ($R_F$) are matched to have substantially the same resistances. Thus, the INA 102 output will be approximately the same voltage value as the reference voltage 370, $V_{CAL}$.

The output node 116 is disconnected from the output of the INA 102 so that the output of the INA 102 can be connected to a positive input of a comparator 352 (a tri-state output of the INA 102 may serve the same purpose). The reference voltage, $V_{CAL}$, from the calibration voltage reference 354 may be, for example but is not limited to, about half way between the supply voltage, $V_{DD}$ (not shown) and the common reference potential 374.

The gain of the INA 102 is calibrated when the voltage at the positive input of the comparator 352 is substantially the same value as the reference voltage, $V_{CAL}$, at the negative input of the comparator 352. The output of the comparator 352 will be at either a logic one (high) or a logic zero (low) depending on whether the voltage on the positive input is greater than, or less than or equal to the calibration voltage. The comparator 352 output 368 may be coupled to a successive approximation register (SAR) in FIG. 5, and is part of a successive approximation analog-to-digital converter (ADC) used in determining which ones of the plurality of constant current sources 230, 232, 240 and/or 242 will be connected in the INA 102 circuit (FIG. 2) as more fully described herein for the digital calibration circuits shown in FIGS. 2 and 5.

Preferably the gain calibration may be performed first since gain adjustment does not substantially affect offset, however, if any offset of the INA 102 is introduced during selection of the gain setting constant current sources 230, 232, 240 and/or 242 (FIG. 2), then during offset calibration the gain setting induced offset will be substantially canceled out.

Figure 4:
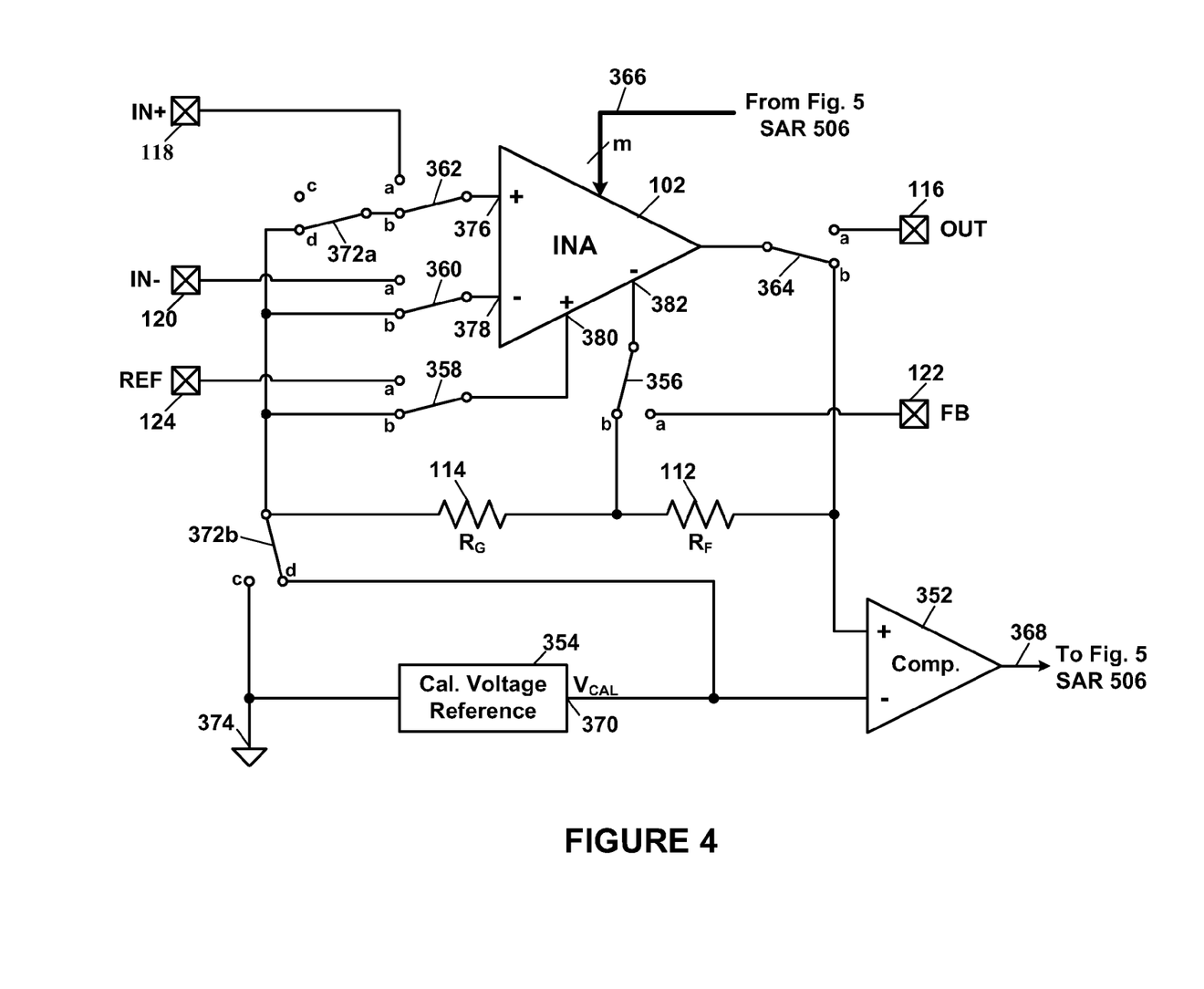
FIG. 4 illustrates a schematic circuit diagram of a switching arrangement for offset calibration of the INA of FIG. 1, according to the teachings of this disclosure.

Referring to FIG. 4, depicted is a schematic circuit diagram of a switching arrangement for offset calibration of the INA of FIG. 1, according to the teachings of this disclosure. Calibration switches 356-364 are shown connected in position "b" and gain/offset calibration switches 372a and 372b are shown connected in position "d" for offset calibration. For normal operation of the INA 102 the calibration switches 356-364 would be connected in position "a". The positions of the gain/offset calibration switches 372a and 372b are irrelevant during normal operation of the INA 102.

During offset calibration, when the calibration switches 356-364 are in position "b" and the gain/offset calibration switches 372a and 372b are in position "d", the differential inputs of the INA 102 are connected to the calibration voltage reference 354. The reference voltage 370, $V_{CAL}$, from the calibration voltage reference 354 may be, for example but is not limited to, about half way between the supply voltage, $V_{DD}$ (not shown) and the common reference potential 374. The external nodes 116 (OUT), 118 (IN+), 120 (IN−), 122 (FB) and 124 (REF) are disconnected from the INA 102, wherein an internal gain setting resistor 114 ($R_G$) and an internal feedback resistor 112 ($R_F$) are used in the INA 102 during the offset calibration operation. The internal gain setting resistor 114 ($R_G$) and the internal feedback resistor 112 ($R_F$) configure the operation of the INA 102 to have high gain for a more accurate offset calibration. The output node 116 is disconnected from the output of the INA 102 so that the output of the INA 102 can be connected to a positive input of a comparator 352 (a tri-state output of the INA 102 may serve the same purpose). A negative input of the comparator 352 is connected to the calibration voltage reference 354 (e.g., reference voltage 370).

Preferably it is desired that when the differential inputs of the INA 102 are connected together and to the reference voltage 370, $V_{CAL}$, the output of the INA 102 should be approximately equal to the reference voltage 370, $V_{CAL}$. This output condition will give the most equal (best) range between positive and negative swings of the output as a function of the differential input voltage during normal operation thereof. The output of the comparator 352 will be at either a logic one (high) or a logic zero (low) depending on whether the voltage on the positive input is greater than, or less than or equal to the calibration voltage. The comparator 352 output 368 may be coupled to a successive approximation register (SAR) in FIG. 5, and is part of a successive approximation analog-to-digital converter (ADC) used in determining which ones of the plurality of constant current sinks 234 and/or 244 will be connected in the INA 102 circuit (FIG. 2) as more fully described herein for the digital calibration circuits shown in FIGS. 2 and 5.

Figure 5:
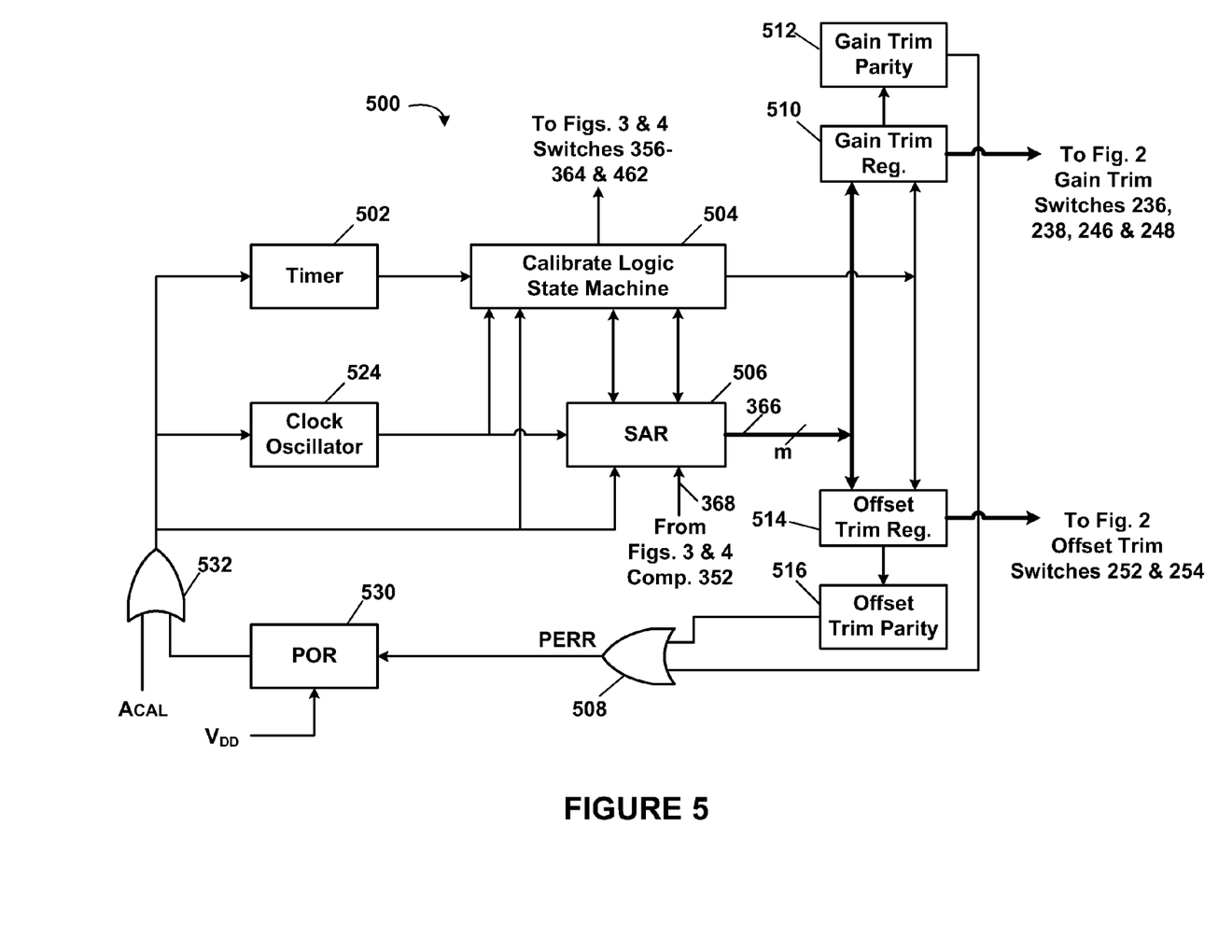
FIG. 5 illustrates a schematic block circuit diagram of a digital calibration circuit used in combination with the circuits shown in FIGS. 2-4, according to the teachings of this disclosure.

Referring to FIG. 5, depicted is a schematic block circuit diagram of a digital calibration circuit used in combination with the circuits shown in FIGS. 2-4, according to the teachings of this disclosure. A digital calibration circuit, generally represented by the numeral 500, comprises a timer 502, a calibrate logic state machine 504, a successive approximation register (SAR) 506, a gain trim register 510, a gain trim register parity detection circuit 512, an offset trim register 514, an offset trim register parity detection circuit 516, an OR gate 508 for logically indicating an error from either one of the trim register parity detection circuits 512 and 514, a power-on-reset (POR) 530, and a clock oscillator 524.

According to the teachings of this disclosure, whenever parity checking of the trim register contents detects a parity error therein, a self auto-calibration cycle may be initiated. This may be implemented by using the gain trim register parity detection circuit 512 to detect a parity error in the trim data contents of the gain trim register 510. When a parity error is detected, the gain trim register parity detection circuit 512 asserts a parity error detected signal and the POR 530 will initiate the start of a new self auto-calibration cycle. Likewise when a parity error is detected in the offset trim register 514, the offset trim register parity detection circuit 516 asserts a parity error detected signal and the POR 530 will initiate the start of a new self auto-calibration cycle. An OR gate 508 may be used to combine parity error detected signals from the gain trim register parity detection circuit 512 or the offset trim register parity detection circuit 516. Other logic combinations may be implemented instead of the OR gate 508 and is contemplated herein.

During a self auto-calibration cycle, the parity bit may be automatically determined by the calibrate logic state machine 504 and stored in a parity bit location of the trim register 510 or 514. In this example, there is one parity bit for each trim register 510 and 514. If a parity error occurs (during normal operation of the INA 102), a power-on-reset from the POR 530 is forced and a new auto-calibration cycle takes place. This is important because the trim register contents may be stored in volatile registers (memory), and the trim data contained therein may be corrupted during a power glitch. Also a soft data error may occur from cosmic radiation, e.g., space applications. Therefore, parity checking of the trim registers 510 and 514 contents provide some protection against corruption of gain and offset trim value data storage in a volatile memory configuration. On the other hand, the trim register contents may be stored in non-volatile memory, and a parity bit and parity checking may not be needed in a non-volatile memory configuration. It is contemplated and within the scope of this disclosure that trim data may be stored in volatile and/or non-volatile memory, with or without a parity bit and parity checking.

An auto-calibration may also be initiated by toggling a user programmed auto-calibration input, $A_{CAL}$. This feature avoids having to power down the mixed signal integrated circuit device to re-calibrate the INA 102 therein. It also saves time because the delay time is much shorter than if a complete power-up is required (e.g., approximately 1 millisecond versus 150 milliseconds). At power-up, the delay is much longer because the timer time-out is designed to wait for system power supplies to settle (stabilize). If a calibration is initiated by the auto-calibration input, $A_{CAL}$, such a long delay is not required.

Having the $A_{CAL}$ calibration input makes it easy for an applications program, e.g., a control signal from a microcontroller to cause a self auto-calibration by toggling a logic level to the $A_{CAL}$ calibration input. The microcontroller and/or circuits within a self auto-calibration integrated circuit device (not shown) could invoke a self auto-calibration, according to the teachings of this disclosure, based upon any change in a system conditions, e.g., power supply voltage, temperature, and/or at fixed time-intervals.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. An instrumentation amplifier having gain and offset calibration using constant current sources and sinks, comprising:
   a first transconductance stage having positive and negative voltage inputs, and positive and negative current outputs;
   a second transconductance stage having positive and negative voltage inputs, and positive and negative current outputs;
   a trans-impedance amplifier having positive and negative current inputs and a voltage output;
   the positive current outputs of the first and second transconductance stages and the positive current input of the trans-impedance amplifier are coupled together;
   the negative current outputs of the first and second transconductance stages and the negative current input of the trans-impedance amplifier are coupled together;
   a first plurality of constant current sources;
   a first plurality of switches, wherein the first plurality of switches selectably couple certain ones of the first plurality of constant current sources to the first transconductance stage;
   a second plurality of constant current sources;
   a second plurality of switches, wherein the second plurality of switches selectably couple certain ones of the second plurality of constant current sources to the second transconductance stage;
   a third plurality of constant current sinks;
   a third plurality of switches, wherein the third plurality of switches selectably connect certain ones of the third plurality of constant current sinks to the positive current outputs of the first and second transconductance stages;
   a fourth plurality of constant current sinks; and
   a fourth plurality of switches, wherein the fourth plurality of switches selectably couple certain ones of the fourth plurality of constant current sinks to the negative current outputs of the first and second transconductance stages;
   whereby gain adjustment of the instrumentation amplifier is provided by selectably coupling the certain ones of the first and second plurality of constant current sources to the first and second transconductance stages, respectively; and
   whereby input offset adjustment of the instrumentation amplifier is provided by selectably coupling the certain ones of the third and fourth plurality of constant current sinks to the positive current outputs and the negative current outputs, respectively, of the first and second transconductance stages.

2. The instrumentation amplifier according to claim 1, wherein the first transconductance stage comprises:
   a first metal oxide field effect transistor (MOSFET) having a source, gate and drain;
   a second MOSFET having a source, gate and drain;
   wherein the sources of the first and second MOSFETs are selectably coupled to the certain ones of the first plurality of constant current sources;
   wherein the drain of the first MOSFET is the positive current output of the first transconductance stage; and
   wherein the drain of the second MOSFET is the negative current output of the first transconductance stage.

3. The instrumentation amplifier according to claim 2, wherein the first and second MOSFETs are P-channel MOSFETs.

4. The instrumentation amplifier according to claim 2, wherein the first and second MOSFETs are N-channel MOSFETs.

5. The instrumentation amplifier according to claim 1, wherein the second transconductance stage comprises:
   a third metal oxide field effect transistor (MOSFET) having a source, gate and drain;
   a fourth MOSFET having a source, gate and drain;
   wherein the sources of the third and fourth MOSFETs are selectably coupled to the certain ones of the second plurality of constant current sources;
   wherein the drain of the third MOSFET is the positive current output of the second transconductance stage; and
   wherein the drain of the fourth MOSFET is the negative current output of the second transconductance stage.

6. The instrumentation amplifier according to claim 5, wherein the third and fourth MOSFETs are P-channel MOSFETs.

7. The instrumentation amplifier according to claim 5, wherein the third and fourth MOSFETs are N-channel MOSFETs.

8. The instrumentation amplifier according to claim 1, wherein the first, second, third and fourth plurality of switches comprise transistors.

9. The instrumentation amplifier according to claim 1, wherein the instrumentation amplifier is fabricated on an integrated circuit die.

10. The instrumentation amplifier according to claim 1, wherein a plurality of instrumentation amplifiers are fabricated on an integrated circuit die.

11. The instrumentation amplifier according to claim 1, further comprising an auto-calibration circuit for calibrating gain and offset of the instrumentation amplifier.

12. The instrumentation amplifier according to claim 11, wherein the auto-calibration circuit comprises:
a voltage reference providing a reference voltage;
a voltage comparator having first and second analog inputs and a digital output, the first analog input is coupled to a voltage from the output of the trans-impedance amplifier and the second analog input is coupled to the reference voltage from the voltage reference, wherein when the voltage on the first analog input is greater than the reference voltage on the second analog input the digital output is at a first logic level, and when the voltage on the first analog input is less than or equal to the reference voltage on the second analog input, the digital output is at a second logic level;
a successive approximation register (SAR) having a digital input coupled to the digital output of the voltage comparator and outputs coupled to the first, second, third and fourth plurality of switches; and
calibration logic,
wherein when the positive input of the first transconduction stage is coupled to the reference voltage, and the first and second transconduction stages are configured to provide a desired gain of the instrumentation amplifier the calibration logic controls the first and second plurality of switches to selectably couple the certain ones of the first and second plurality of constant current sources so as to calibrate the gain of the instrumentation amplifier, and
wherein when the positive and negative inputs of the first transconduction stage are coupled together and to a reference voltage, and the positive and negative inputs of the second transconduction stage are configured to provide a desired gain of the instrumentation amplifier the calibration logic controls the third and fourth plurality of switches to selectably couple the certain ones of the third and fourth plurality of constant current sinks so as to calibrate the input offset of the instrumentation amplifier.

13. The instrumentation amplifier according to claim 12, further comprising first, second, third and fourth registers coupled between the SAR and the first, second, third and fourth plurality of switches, respectively, for storing auto-calibration values from the SAR.

14. The instrumentation amplifier according to claim 12, further comprising parity checking of the first, second, third and fourth registers.

15. A method for calibrating gain and offset of an instrumentation amplifier using constant current sources and sinks, said method comprising the steps of:
adjusting gain of an instrumentation amplifier by selectably coupling certain ones of a plurality of constant current sources to first and second transconduction stages of the instrumentation amplifier; and
adjusting offset of the instrumentation amplifier by selectably coupling certain ones of a plurality of constant current sinks to positive and negative outputs of the first and second transconduction stages of the instrumentation amplifier.

16. The method according to claim 15, wherein the step of adjusting the gain of the instrumentation amplifier comprises the steps of:
coupling a positive input of the instrumentation amplifier to a first gain setting resistor network and a negative input of the instrumentation amplifier to a power source common;
coupling a feedback input of the instrumentation amplifier to a second gain setting resistor network and a reference input of the instrumentation amplifier to the power source common, wherein the first and second gain setting resistor networks are substantially the same;
comparing an output voltage of the instrumentation amplifier to the reference voltage; and
selectably coupling certain ones of the plurality of constant current sources to the first and second transconduction stages of the instrumentation amplifier until the output voltage from the instrumentation amplifier is substantially the same as the reference voltage.

17. The method according to claim 15, wherein the step of adjusting the offset of the instrumentation amplifier comprises the steps of:
coupling positive and negative inputs of the instrumentation amplifier to a reference voltage;
coupling a feedback input of the instrumentation amplifier to a gain setting resistor network and a reference input of the instrumentation amplifier to the reference voltage;
comparing an output voltage of the instrumentation amplifier to a reference voltage; and
selectably coupling certain ones of the plurality of constant current sinks to the positive and negative outputs of the first and second transconduction stages of the instrumentation amplifier until the output voltage from the instrumentation amplifier is substantially the same as the reference voltage.

18. The method according to claim 15, wherein the step of adjusting the gain occurs before the step of adjusting the offset.

* * * * *